United States Patent
Kim et al.

(10) Patent No.: US 11,657,031 B2
(45) Date of Patent: May 23, 2023

(54) APPARATUS AND METHOD FOR GENERATING DATA QUALITY INFORMATION OF ELECTRIC POWER EQUIPMENT

(71) Applicant: Korea Electric Power Corporation, Naju-si (KR)

(72) Inventors: Chung Hyo Kim, Daejeon (KR); Jun Churl Yoon, Daejeon (KR); Young Sung Lee, Daejeon (KR); Yong Hun Lim, Daejeon (KR); Seong Ho Ju, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 778 days.

(21) Appl. No.: 16/068,642

(22) PCT Filed: Jun. 22, 2017

(86) PCT No.: PCT/KR2017/006565
§ 371 (c)(1),
(2) Date: Jul. 6, 2018

(87) PCT Pub. No.: WO2018/199386
PCT Pub. Date: Nov. 1, 2018

(65) Prior Publication Data
US 2021/0165775 A1 Jun. 3, 2021

(30) Foreign Application Priority Data
Apr. 28, 2017 (KR) ........................ 10-2017-0055152

(51) Int. Cl.
*G06F 7/00* (2006.01)
*G06F 17/00* (2019.01)
(Continued)

(52) U.S. Cl.
CPC ....... *G06F 16/2358* (2019.01); *G01R 21/133* (2013.01); *G06F 13/128* (2013.01); *G06F 16/2282* (2019.01); *G06F 16/2365* (2019.01)

(58) Field of Classification Search
None
See application file for complete search history.

(56) References Cited

U.S. PATENT DOCUMENTS

| | | | |
|---|---|---|---|
| 2015/0067819 A1* | 3/2015 | Shribman | H04L 67/02 709/218 |
| 2015/0088463 A1* | 3/2015 | Li | A61B 5/746 702/189 |

(Continued)

FOREIGN PATENT DOCUMENTS

| | | |
|---|---|---|
| KR | 100536516 B | 12/2005 |
| KR | 1020170014686 A | 2/2017 |
| KR | 1020170014686 E | 2/2017 |

OTHER PUBLICATIONS

PCT ISA 237.

(Continued)

*Primary Examiner* — Tuan A Pham
(74) *Attorney, Agent, or Firm* — Foundation Law Group (57) ABSTRACT

The present invention relates to an apparatus for generating data quality information of electric power equipment, the apparatus including a data collector configured to collect a piece of measured data of electric power equipment, a storage configured to store a previous value and a set value for the piece of measured data, and a quality value generator configured to generate a quality value for the piece of measured data by applying the piece of measured data, the previous value, and the set value to a predetermined logic circuit.

8 Claims, 10 Drawing Sheets

(51) Int. Cl.
    *G06F 16/23*    (2019.01)
    *G06F 16/22*    (2019.01)
    *G01R 21/133*   (2006.01)
    *G06F 13/12*    (2006.01)

(56) References Cited

U.S. PATENT DOCUMENTS

2017/0032015 A1    2/2017   Shkapenyuk et al.
2018/0059656 A1*   3/2018   Hiruta .................. G01R 31/343
2018/0189655 A1*   7/2018   Oh ......................... G06N 20/00

OTHER PUBLICATIONS

PCT ISR 210.
A Study on Improvement Method for Statistical Process and Quality of Electric Demand Load Profile, The Transactions of the Korean Institute of Electrical Engineers 57(11) 2008.00, 2080-2085.

\* cited by examiner

| category | Configuration (predefined) | | | | | | | | | | |
|---|---|---|---|---|---|---|---|---|---|---|---|
| bit | 32 | 2048 | | 8 | 64 | 64 | 64 | 64 | 64 | 8 | 8 |
| | name | defined index | definedvalue(unit) | defined DataType | min Value | max Value | refMin Value | refMax Value | bin Error Time | bin Error Number | mes Error Time |
| relation | · | | | overflow | outOfRange | | badRef_& inaccurate | | oscillatory | | old Data |
| index_A1 | 0x0001 | 00-SUBSTATION TL#1 A-PHASE VOLTAGE(V) | DOUBLE | 0 | 180000 | | | | 5 | | 8 |
| index_A2 | 0x0002 | 00-SUBSTATION M#1 A-PHASE VOLTAGE(V) | DOUBLE | 0 | 180000 | | | | 5 | | 8 |
| index_A3 | 0x0003 | 00-SUBSTATION OL#5 EFFECTIVE POWER(kW) | UINT | 0 | 20000 | | | | 5 | | 8 |
| index_A4 | 0x0004 | 00-SUBSTATION OL#5 REACTIVE POWER(kw) | UINT | 0 | 20000 | | | | 5 | | 8 |
| index_A5 | 0x0005 | 00-SUBSTATION OL#5 POWER FACTOR | FLOAT | 0 | 1 | 5000 | 20000 | | 5 | | 8 |
| index_D1 | 0xA001 | 00-SUBSTATION M#1 PRIMARY CB | BINARY | | | | | | 5 | 3 | |
| index_D2 | 0xA002 | 00-SUBSTATION M#1 SECONDARY CB | BINARY | | | | | | 5 | 3 | |

[FIG. 3B]

| pointer | time stamp | value | data type | validity (of flow) | detail quality (8) | | | | | | | | inaccurate | ality | | |
|---|---|---|---|---|---|---|---|---|---|---|---|---|---|---|---|---|
| 8 | 64 | 64 | 8 | 4 | over range | bad Ref | basic Reference | oscillation | failure | in doubt | inaccurate | | | oldData | inconsistent | inaccurate |
| n | Sep. 28, 2016 16:21:00 .011 | 152300 | DOUBLE | 0000 | 0 | 0 | 0 | 0 | 0 | 0 | 0 | | | | | |
| n | Sep. 28, 2016 16:21:00 .011 | 152250 | DOUBLE | 0000 | 0 | 0 | 0 | 0 | 0 | 0 | 0 | 0 | | | | |
| n | Sep. 28, 2016 16:21:00 .011 | 12120 | UNIT | 0000 | 0 | 0 | 0 | 0 | 0 | 0 | 0 | 0 | | | | |
| n | Sep. 28, 2016 16:21:00 .011 | 12490 | UNIT | 0000 | 0 | 0 | 0 | 0 | 0 | 0 | 0 | 0 | | | | |
| n | Sep. 28, 2016 16:21:00 .280 | 0.97038 | FLOAT | 0000 | 0 | 0 | 0 | 0 | 0 | 0 | 0 | 0 | 0 | 0 | 0 | |
| ... | | | | | | | | | | | | | 0 | 0 | 0 | |
| n | Sep. 28, 2016 16:20:01 .255 | 0 | BINARY | 0000 | 0 | 0 | 0 | 0 | 0 | 0 | 0 | 0 | 0 | 0 | 0 | |
| 1 | Sep. 28, 2016 16:20:01 .255 | 0 | BINARY | 0000 | 0 | 0 | 0 | 0 | 0 | 0 | 0 | 0 | | | | |
| n | Sep. 28, 2016 16:20:01 .255 | 0 | BINARY | 0000 | 0 | 0 | 0 | 0 | 0 | 0 | 0 | 0 | 0 | 0 | | |
| 1 | Sep. 28, 2016 16:20:01 .255 | 0 | BINARY | 0000 | 0 | 0 | 0 | 0 | 0 | 0 | 0 | 0 | 0 | 0 | | |

FIG. 4

| NAME | DESCRIPTION | DATA STRUCTURE (LENGTH) | QUALITY FOR RELATED DATA |
|---|---|---|---|
| Configuration | | | |
| definedIndex | INTEGRATED INDEX (FIG. 4) | UINT(32bits) | - |
| definedValue(unit) | DEFINED DATA NAME | STRING(2048bits) | - |
| definedDataType | DEFINED DATA TYPE | ENUMERATE(8bits) | overflow |
| minValue | MINIMUM VALUE THAT DATA CAN HAVE | DOUBLE(64bits) | outOfRANGE |
| maxValue | MAXIMUM VALUE THAT DATA CAN HAVE | DOUBLE(64bits) | |
| reMinValue | MINIMUM VALUE THAT REFERENCE DATA CAN HAVE | DOUBLE(64bits) | badReference & inaccurate |
| reMaxValue | MAXIMUM VALUE THAT REFERENCE DATA CAN HAVE | DOUBLE(64bits) | |
| binErrorTime | MEASUREMENT TIME FOR DETERMINATION OF "ABNORMAL VIBRATION" | SHORT(8bits) | oscillatory |
| binErrorNumber | NUMBER OF VARIATIONS FOR DETERMINATION OF "ABNORMAL VIBRATION" | SHORT(8bits) | oscillatory |
| mesErrorTime | MEASUREMENT PERIOD OF ANALOG (MEASURED) VALUE | SHORT(8bits) | oldData |

FIG. 5

| NAME | DESCRIPTION | DATA STRUCTURE (LENGTH) | QUALITY FOR RELATED DATA |
|---|---|---|---|
| Real Time Data | | | |
| pointer | RECORDING POINT OF NEXT RECEIVED DATA | UINT(8bits) | |
| timeStamp | RECEIVED DATA TIME | UTC(64bits) | oscillatory, oldData |
| value | RECEIVED (CALCULATED) DATA VALUE | dependent on data type | overflow, outOfRange, badReference, oscillatory, oldData, inaccuracy |
| dataType | TYPE OF RECEIVED (CALCULATED) DATA | ENUMERATE(8bits) | overflow |
| validity | DATA QUALITY (INTEGRATED) | ENUMERATE(4bits) | all |
| overflow | CASE IN WHICH TYPE OF DEFINED DATA (DEFINEDATATYPE) AND TYPE OF RECEIVED DATA (DATATYPE) DO NOT MATCH | BINARY(1bit) | - |
| outOfRange | CASE IN WHICH RECEIVED DATA VALUE (VALUE) IS OUT OF RANGE OF MINIMUM VALUE (MINVALUE) AND MAXIMUM (MAXVALUE) THAT DATA CAN SAVE | BINARY(1bit) | - |
| badReference | CASE IN WHICH RECEIVED DATA VALUE (VALUE) IS OUT OF RANGE OF MINIMUM VALUE (REFMINVALUE) AND MAXIMUM VALUE (REFMAXVALUE) OF DATA WHICH SHOULD BE REFERENCED SO AS TO GENERATE CALCULATED DATA VALUE | BINARY(1bit) | - |
| oscillatory | CASE IN WHICH VALUE IS REPEATEDLY VARIED OVER NUMBER OF TIMES (BINERRORNUMBER) ASSIGNED TO SPECIFIED TIME WHEN DEFINED DATA TYPE IS BINARY | BINARY(1bit) | - |
| failure | CASE IN WHICH FAILURE OCCURS IN INTERNAL OR EXTERNAL APPLICATION | BINARY(1bit) | - |
| oldData | CASE IN WHICH RECEIVED (CALCULATED) VALUE IS NOT UPDATED WITHIN ASSIGNED TIME (MEAERRORTIME) WHEN RECEIVED (CALCULATED) VALUE IS AN ANALOG (MEASURED) VALUE | BINARY(1bit) | - |
| inconsistent | CASE IN WHICH SEPARATE APPLICATION FOR EVALUATING DATA INTEGRITY INFORMS OF INCONSISTENCY | BINARY(1bit) | - |
| inaccurate | CASE IN WHICH REFERENCE VALUE DOES NOT EXCEED SPECIFIED VALUE (REFMINVALUE) SO AS TO ENSURE RELIABILITY OF CALCULATED DATA | BINARY(1bit) | - |

| category | Configuration(predefined) | | | | | | | | | |
|---|---|---|---|---|---|---|---|---|---|---|
| bits 32 | 2048 | 8 | 64 | 64 | 64 | 64 | 64 | 8 | 8 |
| name | defined Index | value name(unit) | defined DataType | min Value | max Value | refMin Value | refMax Value | bin Error Time | bin Error Number | mes Error Time |
| index_A1 | 0x0001 | OO-SUBSTATION TL#1 A-PHASE VOLTAGE(V) | DOUBLE | 0 | 180000 | - | - | - | - | 5 |
| index_A2 | 0x0002 | OO-SUBSTATION Mtr#1 A-PHASE VOLTAGE(V) | DOUBLE | 0 | 180000 | - | - | - | - | 5 |
| index_A3 | 0x0003 | OO-SUBSTATION DL#5 EFFECTIVE POWER(kW) | UINT | 0 | 20000 | - | - | - | - | 5 |
| index_A4 | 0x0004 | OO-SUBSTATION DL#5 REACTIVE POWER(kW) | UINT | 0 | 20000 | - | - | - | - | 5 |
| index_A5 | 0x0005 | OO-SUBSTATION POWER FACTOR | FLOAT | 0 | 1 | 5000 | 20000 | - | - | 5 |
| index_D1 | 0xA001 | OO-SUBSTATION Mtr#1 PRIMARY CB | BINARY | - | - | - | - | 5 | 2 | - |
| index_D2 | 0xA002 | OO-SUBSTATION Mtr#1 SECONDARY CB | BINARY | - | - | - | - | 5 | 2 | - |

[FIG. 7B]

| pointer | time stamp | value | data type | validity | detail quality | | | | | | | |
|---|---|---|---|---|---|---|---|---|---|---|---|---|
| | | | | | overflow | out of Range | bad Reference | oscillatory | calibrate | failed Data | inconsistent | inaccurate |
| n | Sep. 28. 2016 16:21:00 .011 | 152300 | DOUBLE | 1000 | 0 | 0 | 0 | 0 | 0 | 0 | 0 | 0 |
| n | Sep. 28. 2016 16:21:00 .011 | 152250 | DOUBLE | 1000 | 0 | 0 | 0 | 0 | 0 | 0 | 0 | 0 |
| n | Sep. 28. 2016 16:21:00 .011 | 12120 | UNIT | 1000 | 0 | 0 | 0 | 0 | 0 | 0 | 0 | 0 |
| n | Sep. 28. 2016 16:21:00 .011 | 12490 | UNIT | 1000 | 0 | 0 | 0 | 0 | 0 | 0 | 0 | 0 |
| n | Sep. 28. 2016 16:21:00 .280 | 0.97038 | FLOAT | 1000 | 0 | 0 | 0 | 0 | 0 | 0 | 0 | 0 |
| n | Sep. 28. 2016 16:20:01 .255 | 0 | BINARY | 1000 | 0 | 0 | 0 | 0 | 0 | 0 | 0 | 0 |
| 1 | Sep. 28. 2016 16:20:01 .255 | 0 | BINARY | 1000 | 0 | 0 | 0 | 0 | 0 | 0 | 0 | 0 |

Real time data(#1)

| | time stamp | value | data type | Val. | Val. Detail | | | | | | | |
|---|---|---|---|---|---|---|---|---|---|---|---|---|
| 0x0001 | Sep. 28. 2016 16:21:05 .010 | 152280 | DOUBLE | 1000 | 0 | 0 | 0 | 0 | 0 | 0 | 0 | 0 |
| 0x0002 | Null | 152280 | DOUBLE | 0001 | 0 | 0 | 0 | 0 | 0 | 1 | 0 | 0 |
| 0x0003 | Sep. 28. 2016 16:21:05 .010 | 12145 | UNIT | 1000 | 0 | 0 | 0 | 0 | 0 | 0 | 0 | 0 |
| 0x0004 | Sep. 28. 2016 16:21:05 .010 | 12510 | UNIT | 1000 | 0 | 0 | 0 | 0 | 0 | 0 | 0 | 0 |
| 0x0005 | Sep. 28. 2016 16:21:05 .275 | 0.97082 | FLOAT | 1000 | 0 | 0 | 0 | 0 | 0 | 0 | 0 | 0 |
| ... | | | | | | | | | | | | |
| 0xA001 | Sep. 28. 2016 16:20:02 .158 | 1 | BINARY | 1000 | 0 | 0 | 0 | 0 | 0 | 0 | 0 | 0 |
| 0xA002 | | | | | | | | | | | | |

Real time data(#2)

| | time stamp | value | data type | Val. | Val. Detail | | | | | | | |
|---|---|---|---|---|---|---|---|---|---|---|---|---|
| 0x0001 | Sep. 28. 2016 16:21:10 .015 | 181087 | DOUBLE | 0101 | 0 | 1 | 0 | 0 | 0 | 0 | 0 | 0 |
| 0x0002 | Sep. 28. 2016 16:21:10 .015 | 152400 | DOUBLE | 1000 | 0 | 0 | 0 | 0 | 0 | 0 | 0 | 0 |
| 0x0003 | Sep. 28. 2016 16:21:10 .015 | 12150 | UNIT | 1000 | 0 | 0 | 0 | 0 | 0 | 0 | 0 | 0 |
| 0x0004 | Sep. 28. 2016 16:21:10 .015 | 3604 | UNIT | 1000 | 0 | 0 | 0 | 0 | 0 | 0 | 0 | 0 |
| 0x0005 | Sep. 28. 2016 16:21:10 .280 | 3.37125 | FLOAT | 0101 | 0 | 1 | 1 | 0 | 0 | 0 | 0 | 1 |
| ... | | | | | | | | | | | | |
| 0xA001 | Sep. 28. 2016 16:20:04 .129 | 0 | BINARY | 0101 | 0 | 0 | 1 | 0 | 0 | 0 | 0 | 0 |
| 0xA002 | | | | | | | | | | | | |

Real time data(#n)

FIG. 8

APPARATUS AND METHOD FOR GENERATING DATA QUALITY INFORMATION OF ELECTRIC POWER EQUIPMENT

TECHNICAL FIELD

Exemplary embodiments of the present invention relate to an apparatus and a method for generating data quality information of electric power equipment.

BACKGROUND ART

For the purpose of improving stability and economic feasibility of electric power system, various efforts are made for utilities to introduce a smart grid and apply an intelligent system analysis. In such efforts, various protocols and various electric power equipment are applied in the field.

For example, an electric power system has followed a distributed network protocol (DNP) and mainly has used signals which are transmitted and received by a remote terminal unit (RTU), but a recent electric power system uses various communication protocols such as a Modbus, a user datagram protocol (UDP), and International Electrotechnical Commission (IEC) 61850 in addition to the DNP, as well as uses signals transmitted and received by various electric power equipment such as an intelligent electronic device (IED), an energy storage system (ESS), and a phase measurement unit (PMU) in addition to the RTU. Consequently, information complexity increases significantly.

DISCLOSURE

Technical Problem

An object of the present invention is to provide an apparatus and a method for generating data quality information of electric power equipment, which are capable of reducing information complexity by generating quality information on pieces of measured data of electric power equipment.

Technical Solution

In accordance with one aspect of the present invention, an apparatus for generating data quality information of electric power equipment may include a data collector configured to collect a piece of measured data of electric power equipment, a storage configured to store a previous value and a set value for the piece of measured data, and a quality value generator configured to generate a quality value for the piece of measured data by applying the piece of measured data, the previous value, and the set value to a predetermined logic circuit.

The piece of measured data may have an enumerated structure, and the quality value may correspond to a quality value for a piece of measured data of a hierarchical structure.

The piece of measured data of the enumerated structure may follow at least one among a distributed network protocol (DNP), a Modbus, and a user datagram protocol (UDP), and the piece of measured data of the hierarchical structure may follow a communication protocol of International Electrotechnical Commission (IEC) 61850.

The data collector may collect a piece of measured data of an enumerated structure from the electric power equipment and collects a piece of measured data of a hierarchical structure from a second electric power equipment, the storage may store a previous value and a set value for the piece of measured data of the enumerated structure, and the quality value generator may generate a quality value for the piece of measured data of the enumerated structure.

The quality value generator may convert the piece of measured data from the enumerated structure into a hierarchical structure by applying the generated quality value to the piece of measured data of the enumerated structure.

The quality value generator may generate a second quality value according to verification on the piece of measured data and may generate a comprehensive quality value on the basis of the quality value according to the predetermined logic circuit and the second quality value.

The quality value generator may compare the piece of measured data with the previous value, accumulate a variable value corresponding to the comparison result, and generate a varied quality value according to whether an elapsed time until the variable value reaches a reference value is longer than a reference time.

The set value may include a set measurement period value, and the quality value generator may generate an omitted quality value corresponding to whether the piece of measured data is updated for a period corresponding to a set measurement period value.

The set value may include a set data type value and a set data range value, and the quality value generator may generate a type quality value corresponding to a comparison result between a type of the piece of measured data and the set data type value and may generate a range quality value corresponding to whether the piece of measured data is out of the set data range value.

The piece of measured data may include a power factor value of the electric power equipment, the set value may include a set range value of the power factor value and a set denominator range value of the power factor value, and the quality value generator may generate a range quality value corresponding to whether the power factor value of the electric power equipment is out of the set range value of the power factor value and may generate a reference quality value corresponding to whether a denominator of the power factor value of the electric power equipment is out of the set denominator range value of the power factor value.

In accordance with another aspect of the present invention, a method for generating data quality information of electric power equipment may include collecting a piece of measured data of electric power equipment, generating a data table containing the piece of measured data and a set value, and generating a quality value by applying the data table and a previous data table to a predetermined logic circuit.

The generating of the quality value may include generating a first quality value according to the predetermined logic circuit, generating a second quality value according to verification on the piece of measured data, and generating a comprehensive quality value on the basis of the first quality value and the second quality value.

The quality value may include a type quality value on the basis of a type of the piece of measured data, a range quality value on the basis of a reference range of the piece of measured data, a reference quality value on the basis of a reference range of a reference value of the piece of measured data, a varied quality value on the basis of a variation frequency of the piece of measured data, and an omitted quality value on the basis of an update time for the piece of measured data.

Advantageous Effects

An apparatus and a method for generating data quality information of electric power equipment according to one embodiment of the present invention can reduce information complexity by generating quality information on pieces of measured data of electric power equipment and can improve data integration of an electric power system and efficiencies of an intelligent system analysis and a smart grid operation.

MODE FOR INVENTION

In the following detailed description, reference is made to the accompanying drawings that illustrates, by way of illustration, specific embodiments in which the invention may be practiced. It should be understood that various embodiments of the present invention, although different, are not necessarily mutually exclusive. For example, specific forms, structures, and characteristics described herein in connection with one embodiment may be implemented within other embodiments without departing from the spirit and scope of the present invention. Further, it should be understood that the location or arrangement of individual elements within each disclosed embodiment may be modified without departing from the spirit and scope of the present invention. The following detailed description, therefore, is not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Hereinafter, exemplary embodiments of the present invention will be described in detail with reference to the accompanying drawings so as to enable those skilled in the art to which the present invention pertains to practice the present invention.

Figure 1:
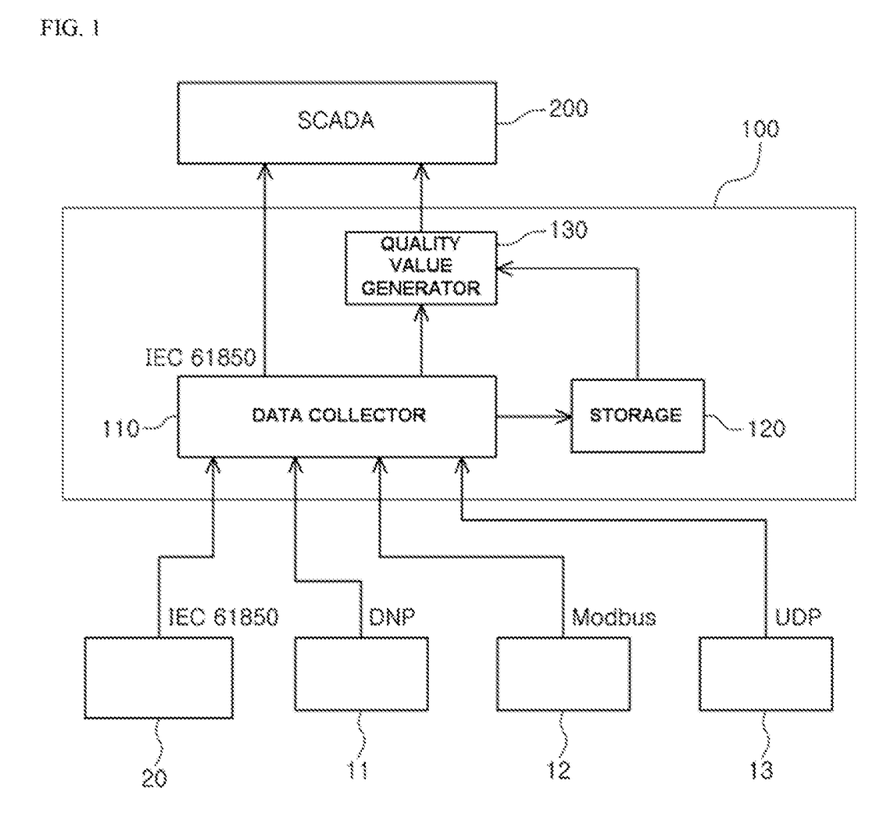
FIG. 1 is a diagram illustrating a multiple collection type of an apparatus for generating data quality information of electric power equipment according to one embodiment of the present invention.

FIG. 1 is a diagram illustrating a multiple collection type of an apparatus for generating data quality information of electric power equipment according to one embodiment of the present invention.

Figure 2:
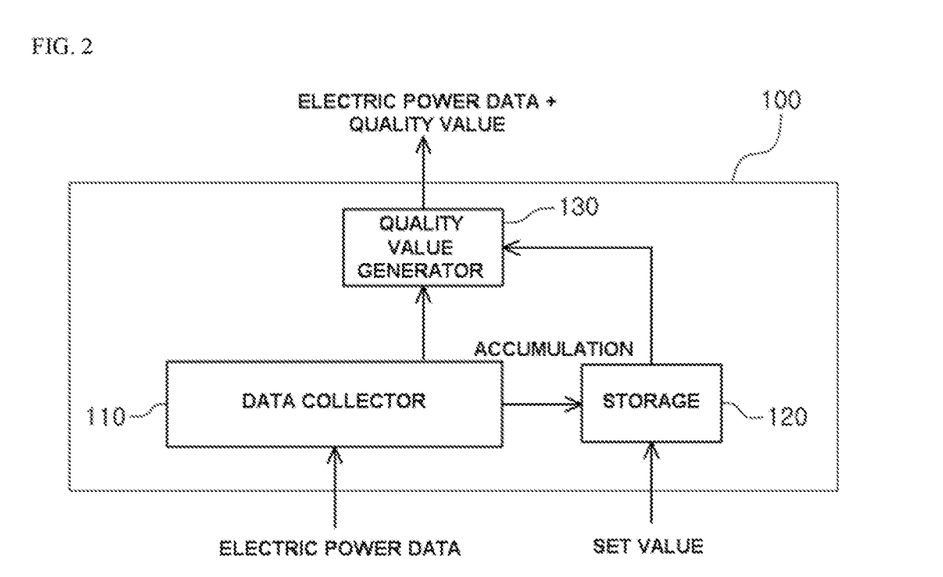
FIG. 2 is a diagram illustrating a single collection type of an apparatus for generating data quality information of electric power equipment according to one embodiment of the present invention.

FIG. 2 is a diagram illustrating a single collection type of an apparatus for generating data quality information of electric power equipment according to one embodiment of the present invention.

Referring to FIGS. 1 and 2, an apparatus 100 for generating data quality information of electric power equipment according to one embodiment of the present invention may include a data collector 110, a storage 120, and a quality value generator 130.

For example, the apparatus 100 for generating data quality information of electric power equipment may collect pieces of measured data from a plurality of electric power equipment, transmit pieces of data corresponding to the collected pieces of measured data to a higher level system 200 such as a front end processor (FEP) of a supervisory control and data acquisition (SCADA), and act as a proxy-gateway.

The data collector 110 may collect pieces of measured data from the plurality of electric power equipment. For example, the data collector 110 may collect pieces of measured data from a plurality of first electric power equipment 1, 12, and 13 and pieces of measured data from second electric power equipment 20.

Here, the plurality of first electric power equipment 11, 12, and 13 may transmit pieces of measured data of an enumerated structure to the data collector 110 according to a communication protocol such as a distributed network protocol (DNP), a Modbus, and a user datagram protocol (UDP). Here, one exemplary form of the enumerated structure may include a structure in which respective values have a mutually parallel relationship.

Further, the second electric power equipment 20 may transmit pieces of measured data of a hierarchical structure to the data collector 110 according to a communication protocol such as International Electrotechnical Commission (IEC) 61850. Here, one exemplary form of the hierarchical structure may include a structure in which a single second electric power equipment 20 corresponds to a plurality of logical devices, a single logical device corresponds to a plurality of logical nodes, and a single logical node corresponds to a plurality of data objects, and the one exemplary form may have a structure similar to a unified modeling language (UML) format.

Further, the hierarchical structure may include a quality value as a value of a data object hierarchy, wherein the quality value is an index barometer indicating how reliable the pieces of measured data is from a higher level system or an operator, from a generation process of the pieces of measured data. Therefore, the quality value may improve the efficiency of data integration, an intelligent system analysis, and a smart grid operation of the higher level system 200.

Generally, since the quality value is not included in the enumerated structure, compatibility of the pieces of measured data of the hierarchical structure with the pieces of measured data of the enumerated structure may be low. The apparatus 100 for generating data quality information of electric power equipment according to one embodiment of the present invention may improve compatibility of the pieces of measured data of the enumerated structure with the pieces of measured data of the hierarchical structure by generating the quality value in the pieces of measured data of the enumerated structure.

The storage 120 may store previous values and set values for the pieces of measured data of the enumerated structure. For example, the storage 120 may store the previous values and the set values according to a format of a data table shown in FIGS. 3A and 3B. For example, the storage 120 may store set values shown in FIG. 4. For example, the storage 120 may store previous values and current values for pieces of measured data shown in FIG. 5

The quality value generator 130 may generate quality values for pieces of measured data which are collected by applying the pieces of measured data of the enumerated structure, the previous values, and the set values to predetermined logic circuits. For example, the predetermined logic circuits may include logic circuits shown in FIG. 6.

Accordingly, the pieces of measured data of the enumerated structure, in which the quality values are not initially included, may include the quality values. Since the quality values may correspond to quality values of the hierarchical structure, the compatibility of the pieces of measured data of the enumerated structure with the pieces of measured data of the hierarchical structure may be improved. Further, the quality values may improve the efficiency of data integration, an intelligent system analysis, and a smart grid operation of the higher level system 200.

Meanwhile, the quality value generator 130 may combine the generated quality values with the pieces of measured data of the enumerated structure or apply the generated quality values to the pieces of measured data of the enumerated structure, thereby converting the pieces of measured data of the enumerated structure into pieces of measured data of a hierarchical structure and transmitting the converted pieces of measured data to the higher level system 200.

Figure 3A:
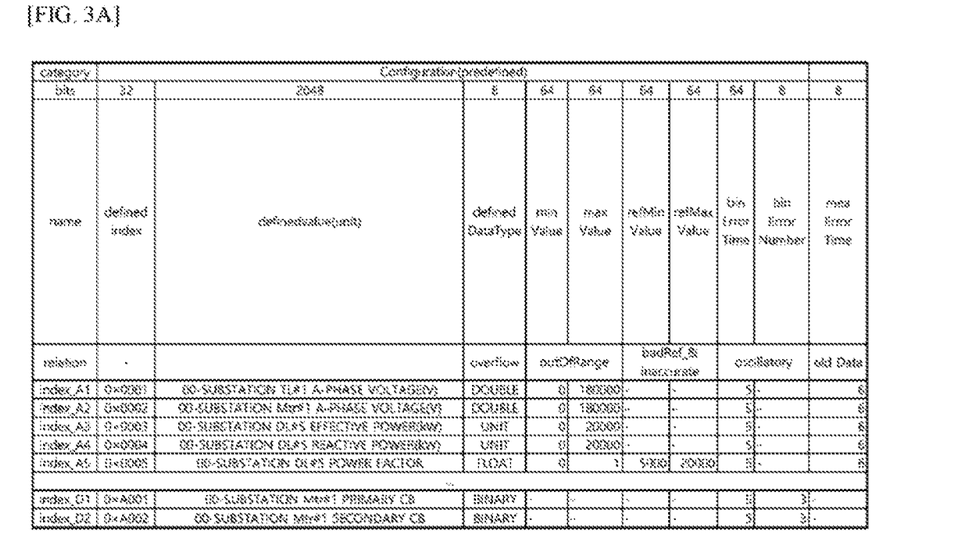
FIG. 3A and FIG. 3B are diagrams exemplifying a data table for generating quality values.
Figure 3B:
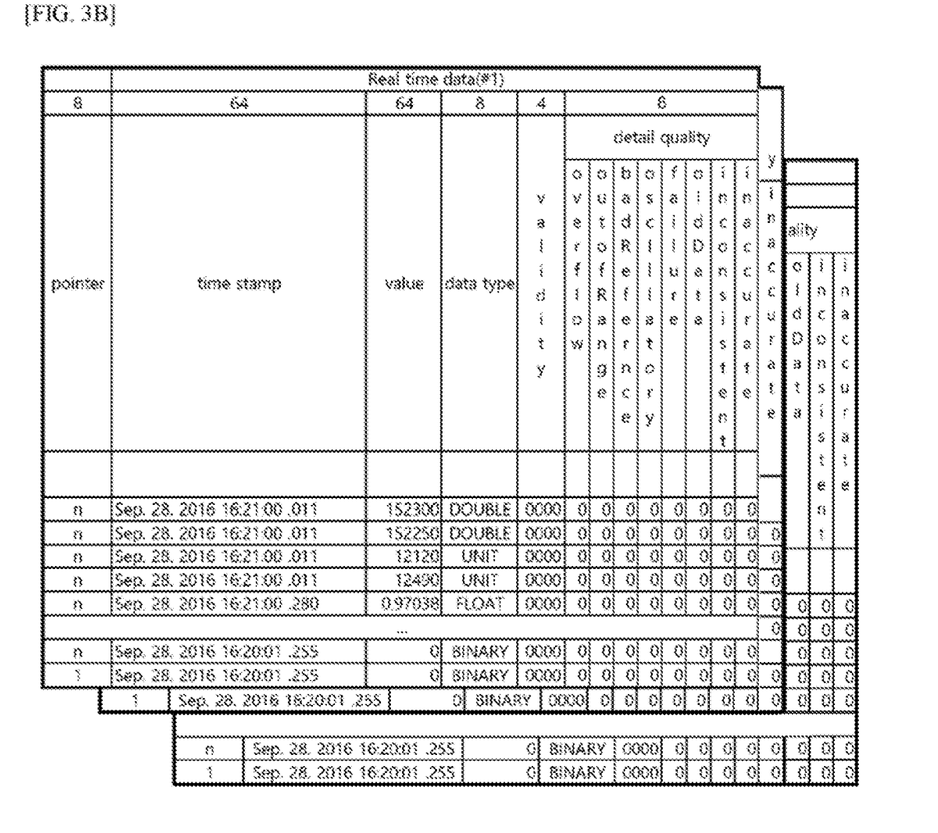

FIG. 3A and FIG. 3B are diagrams exemplifying a data table for generating quality values, FIG. 3A is a left part of the data table and FIG. 3B is a right part of the data table.

Referring to FIGS. 3A and 3B, the data table may include set values (Configuration) and pieces of measured data (Real time data).

Figure 4:
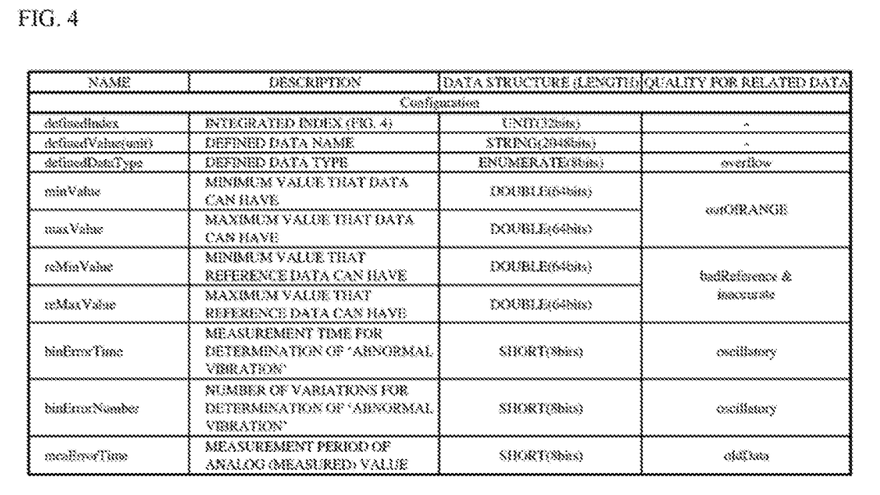
FIG. 4 is a diagram summarizing set values in the data table of FIGS. 3A and 3B.

FIG. 4 is a diagram summarizing the set values in the data table of FIGS. 3A and 3B.

Referring to FIG. 4, the set values (Configuration) may include a set data type value (definedDataType), a set minimum data value (minValue), a set maximum data value (maxValue), a set minimum reference data value (refMinValue), a set maximum reference data value (refMaxValue), a variable time (binErrorTime), a variable value (binErrorNumber), and a set measurement period value (meaErrorTime).

The set data type value (definedDataType) may affect a type quality value (overflow).

The set minimum data value (minValue) and the set maximum data value (maxValue) may affect a range quality value (outOfRange).

The set minimum reference data value (refMinValue) and the set maximum reference data value (refMaxValue) may affect reference quality values (badReference and inaccurate).

The variable time (binErrorTime) and the variable value (binErrorNumber) may affect a varied quality value (oscillatory).

The set measurement period value (meaErrorTime) may affect an omitted quality value (oldData).

Figure 5:
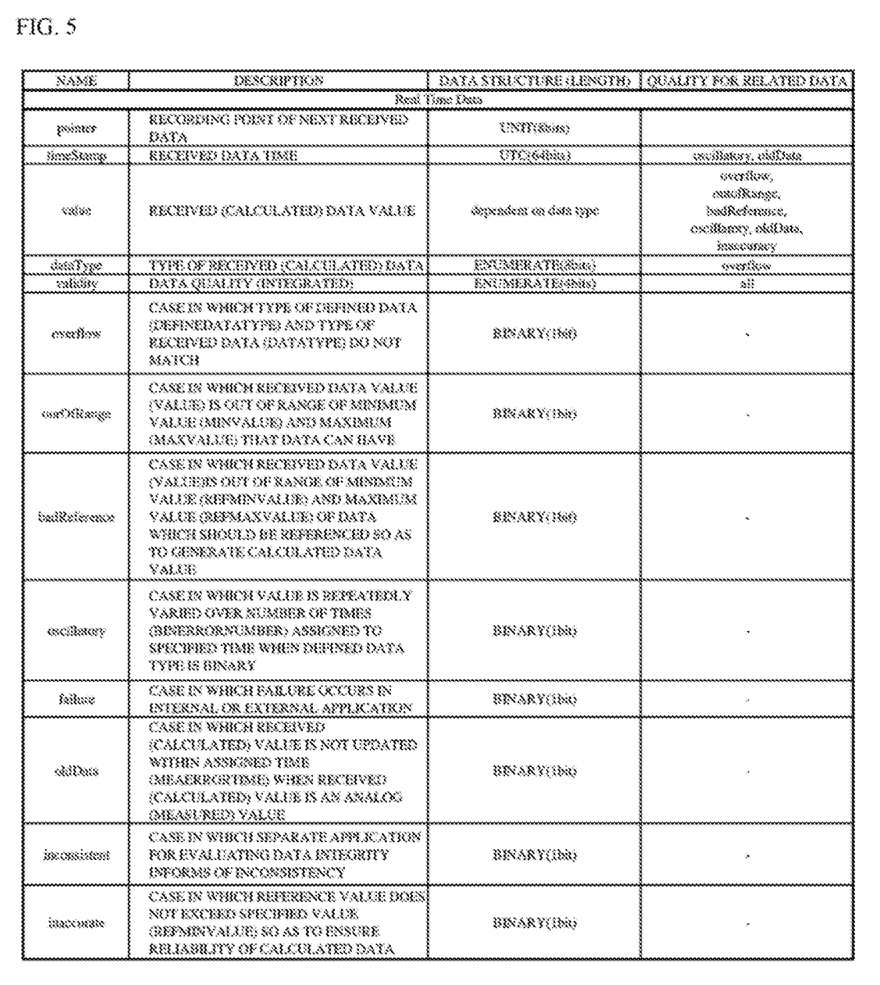
FIG. 5 is a diagram summarizing pieces of measured data and quality values in the data table of FIGS. 3A and 3B.

FIG. 5 is a diagram summarizing pieces of measured data and quality values in the data table of FIGS. 3A and 3B.

Referring to FIG. 5, the pieces of measured data (Real time data) may include a sequence number value (pointer), a measured time value (timeStamp), a measured value (value), and a data type value (dataType).

The measured time value (timeStamp) may affect the varied quality value (oscillatory) and the omitted quality value (oldData).

The data type value (dataType) may affect the type quality value (overflow).

Referring to FIG. 5, the quality values may include a comprehensive quality value (validity), a type quality value (overflow), a range quality value (outOfRange), reference quality values (badReference and inaccurate), a varied quality value (oscillatory), and an omitted quality value (oldData) and may further include a failure verification value (failure) and an inconsistency verification value (inconsistent).

Figure 6:
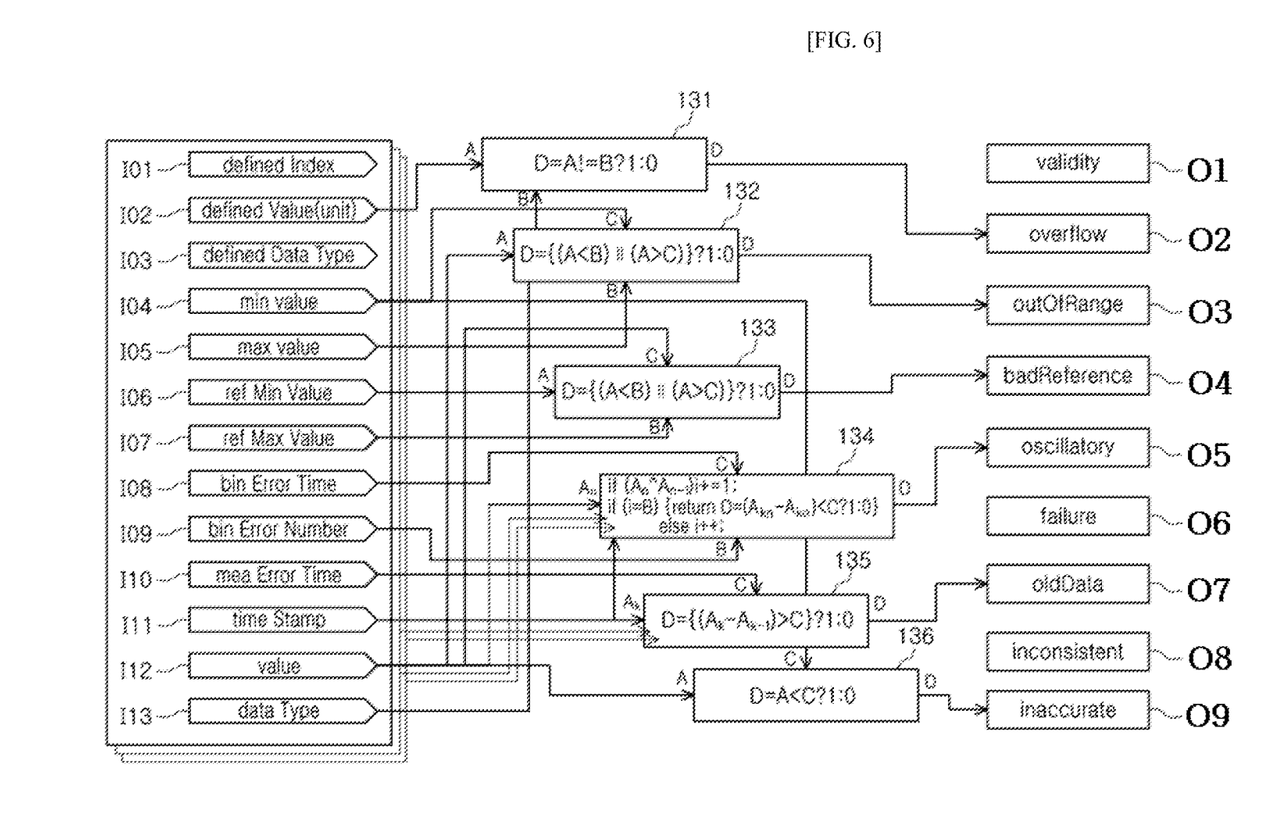
FIG. 6 is a diagram exemplifying a predetermined logic circuit for generating the quality values.

The type quality value (overflow), the range quality value (outOfRange), the reference quality values (badReference and inaccurate), the varied quality value (oscillatory), and the omitted quality value (oldData) may be generated according to a predetermined logic circuit shown in FIG. 6.

Second quality values such as the failure verification value (failure) and the inconsistency verification value (inconsistent) may be values generated through additional verification by a separate application.

The comprehensive quality value (validity) may have a comprehensive value on the basis of a quality value generated according to a predetermined logic circuit and the second quality values.

FIG. 6 is a diagram exemplifying a predetermined logic circuit for generating the quality values.

Referring to FIG. 6, the predetermined logic circuit may include first, second, third, fourth, fifth, and sixth logic circuits 131, 132, 133, 134, 135, and 136.

The first logic circuit 131 may receive a set data type value I02 and a data type value I13 and may output a type quality value O2 dependent on whether the received values are equal to each other.

The second logic circuit 132 may receive a measured value I12, a set minimum data value I04, and a set maximum data value I05 and may output a range quality value O3 which is dependent on a large or small relationship between the measured value I12 and the set minimum data value I04 and a large or small relationship between the measured value I12 and the set maximum data value I05.

The third logic circuit 133 may receive the measured value I12, a set minimum reference data value I06, and a set maximum reference data value I07 and may output a reference quality value O4 which is dependent on a large or small relationship between the measured value I12 and the set minimum reference data value I06 and a large or small relationship between the measured value I12 and the set maximum reference data value I07.

The fourth logic circuit 134 may receive the measured value I12, a variable time I08, and a variable value I09 and may output a varied quality value O5. The fourth logic circuit 134 may compare the measured value I12 with a previous value thereof, accumulate the variable value I09 according to the comparison result, and generate a varied quality value O5 according to whether an elapsed time until the variable value I09 reaches a reference value is greater than or equal to a variable time 108.

The fifth logic circuit 135 may receive a measurement time value I11 and a set measurement period value I10 and may output an omitted quality value O7 dependent on a comparison result between the measurement time value I11 and the set measurement period value I10. That is, the fifth logic circuit 135 may generate the omitted quality value O7 according to whether the measured value I12 is updated for a period corresponding to the set measurement period value I10.

The sixth logic circuit 136 may receive the measured value I12 and the set minimum data value I04 and may output a second reference quality value O9 corresponding to a comparison result between the measured value I12 and the set minimum data value I04.

Meanwhile, the predetermined logic circuit may further receive a defined value I01 and a defined data type value I03 and may further output a comprehensive quality value O1, a failure verification value O6, and an inconsistency verification value O8.

Figure 7A:
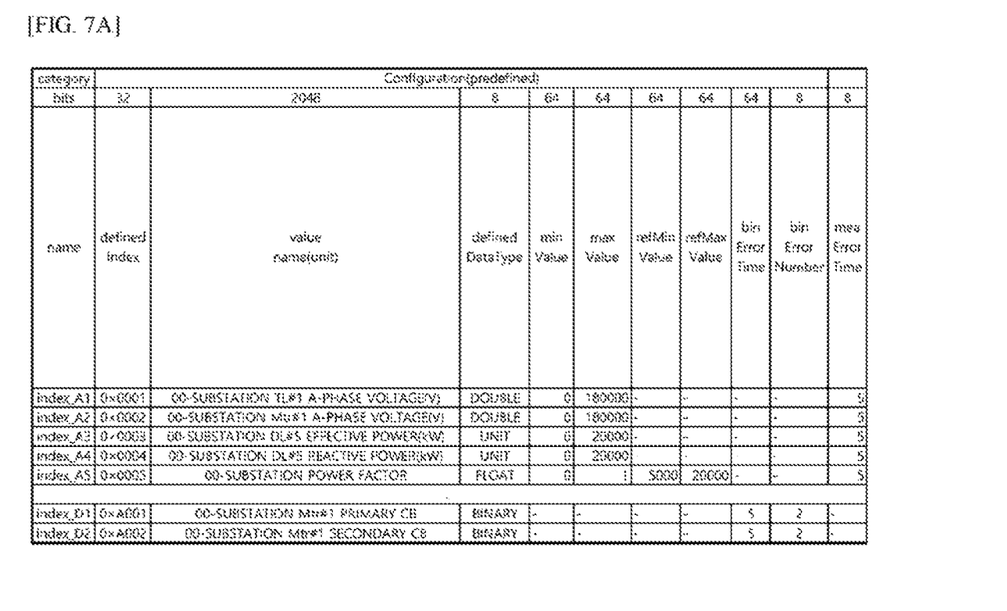
FIG. 7A and FIG. 7B are diagrams exemplifying generation of quality values of a data table to which pieces of measured data from a substation are applied.
Figure 7B:
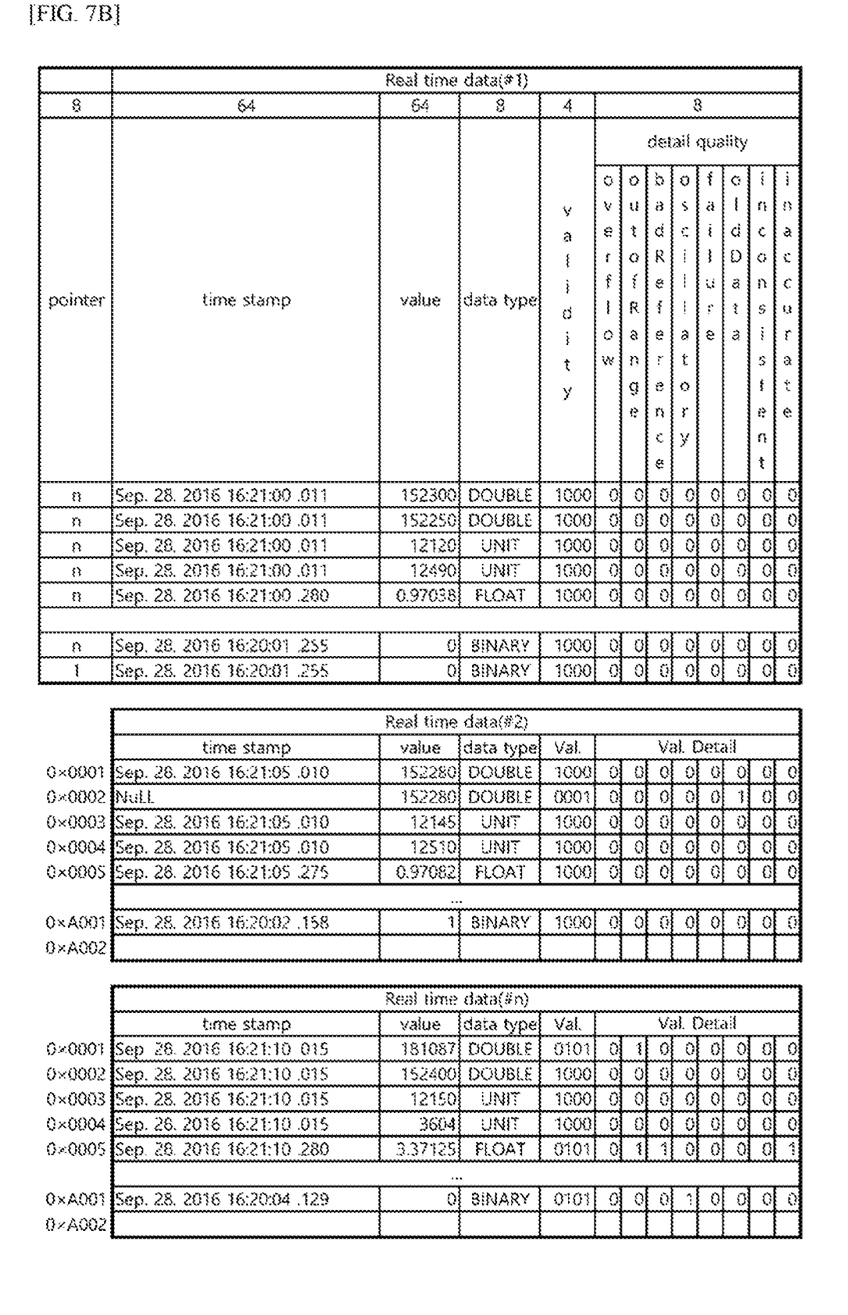

FIG. 7A and FIG. 7B are diagrams exemplifying generation of quality values of a data table to which pieces of measured data from a substation are applied, FIG. 7A is a left part of the data table and FIG. 7B is a right part of the data table.

Referring to FIG. 7A and FIG. 7B, the pieces of measured data may include a power factor value of electric power equipment (substation). A set minimum value of the power factor value of the electric power equipment (substation) may be 0, a set maximum value thereof may be 1, a set minimum reference data (reactive power) value may be 5000, and a set maximum reference data (reactive power) value may be 20000.

A power factor value of 0.97038 at a first measurement time #1 may be larger than the set minimum value of the power factor value and may be smaller than the set maximum value of the power factor value, and a reactive power value of 12490 at the first measurement time #1 may be larger than the set minimum value of the power factor value. Therefore, a quality value of the power factor value at the first measurement time #1 may correspond to a normal quality value.

A power factor value of 0.97082 at a second measurement time #2 may be larger than the set minimum value of the power factor value and may be smaller than the set maximum value of the power factor value, and a reactive power value of 12510 at the second measurement time #2 may be larger than the set minimum value of the power factor value. Therefore, a quality value of the power factor value at the second measurement time #2 may correspond to a normal quality value of 0.

A power factor value of 3.37125 at an n-th measurement time # n may be larger than the set maximum value of the power factor value, and a reactive power value of 3604 at the n-th measurement time # n may be smaller than a set minimum value 5000 of the power factor value. Therefore, a quality value of the power factor value at the n-th measurement time # n may correspond to an abnormal quality value of 1.

Figure 8:
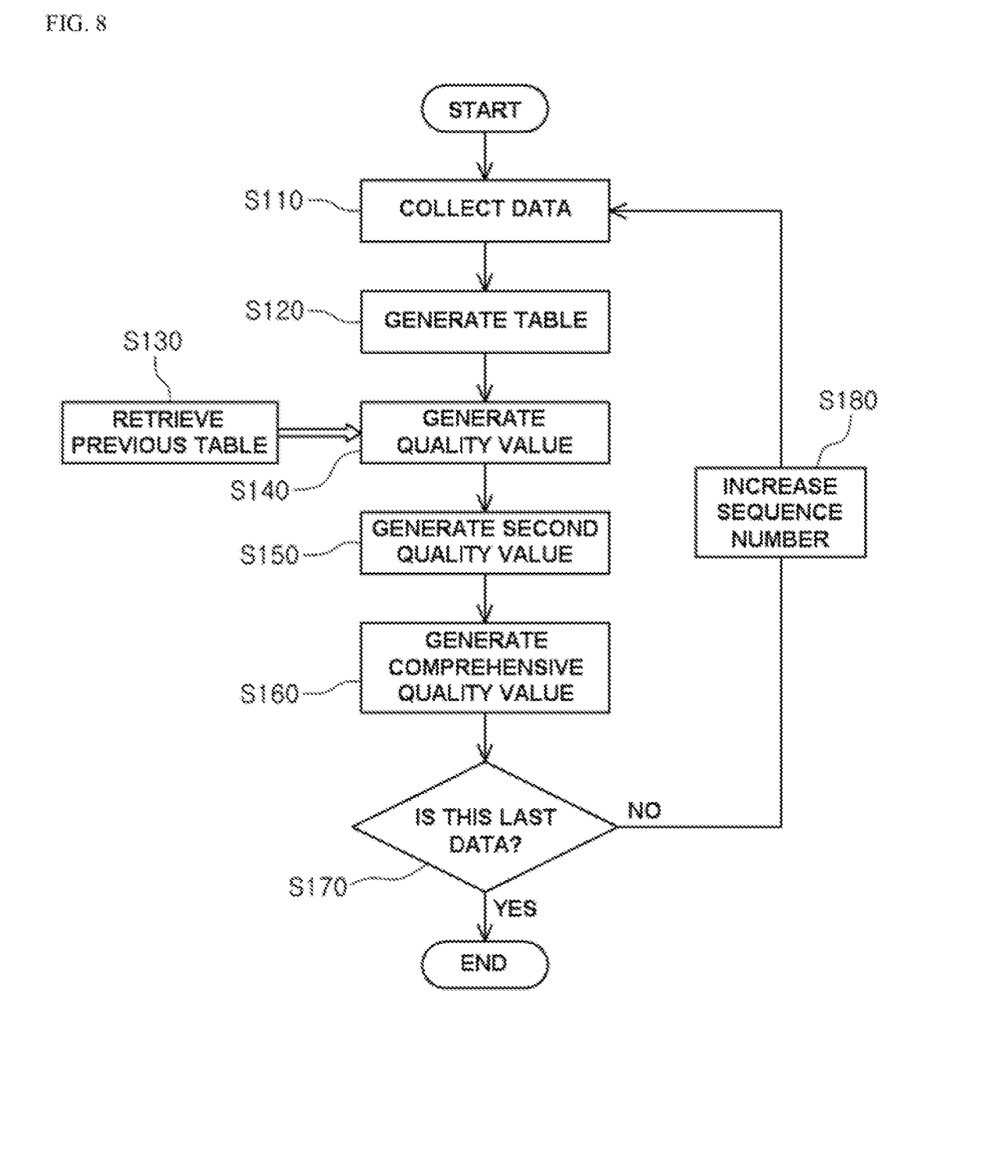
FIG. 8 is a flowchart illustrating a method of generating data quality information of electric power equipment according to one embodiment of the present invention.

FIG. 8 is a flowchart illustrating a method of generating data quality information of electric power equipment according to one embodiment of the present invention.

Referring to FIG. 8, the method for generating data quality information of electric power equipment according to one embodiment of the present invention may include collecting pieces of measured data of electric power equipment (S110), generating a data table containing the pieces of measured data and set values (S120), retrieving a previous data table (S130), and generating first quality values by applying the data table and the previous data table to a predetermined logic circuit (S140) and may further include generating second quality values according to verification on the pieces of measured data (S150), generating comprehensive quality values on the basis of the first quality values and the second quality values (S160), determining whether a piece of measured data is a last piece of data (S170), and increasing a sequence number of the piece of measured data (S180).

Here, the quality values may include a type quality value on the basis of a type of the piece of measured data, a range quality value on the basis of a reference range of the piece of measured data, a reference quality value on the basis of a reference range of a reference value of the piece of measured data, a varied quality value on the basis of a variation frequency of the piece of measured data, and an omitted quality value on the basis of an update time for the piece of measured data.

Meanwhile, the method for generating data quality information of electric power equipment may be implemented by a computing device which will be described below. The computing device may include a personal computer, a server computer, a hand-held or laptop device, a mobile device (a mobile phone, a personal digital assistant (PDA), a media player, and the like), a multiprocessor system, a consumer electronic device, a minicomputer, a mainframe computer, and a distributed computing environment including any systems or devices as described above, but the present invention is not limited thereto.

The computing device may include at least one processing unit and at least one memory. For example, the processing unit may include a central processing unit (CPU), a graphics processing unit (GPU), a microprocessor, an application specific integrated circuit (ASIC), a field programmable gate army (FPGA), and the like and may have a plurality of cores. The memory may be a volatile memory (e.g., a random access memory (RAM) and the like), a non-volatile memory (e.g., a read only memory (ROM), a flash memory, and the like), or a combination thereof.

The processing unit may serve as the above-described quality value generator, and the memory may serve as the above-described storage.

Further, the computing device may additionally include a storage. The storage may include a magnetic storage, an optical storage, and the like, but the present invention is not limited thereto. The storage may store computer-readable commands for implementing one or more embodiments disclosed herein, and other computer-readable commands for implementing an operating system, an application program, and the like. The computer-readable commands stored in the storage may be loaded into the memory and may be executed by the processing unit.

Further, the computing device may include input device(s) and output device(s). For example, the input device(s) may include a keyboard, a mouse, a pen, a voice input device, a touch input device, an infrared camera, a video input device, or any other input device. For example, the output device(s) may include one or more displays, speakers, printers, or any other output devices. Further, the computing device may use an input device or an output device, which is provided in another computing device, as the input device(s) or the output device(s).

The input device(s) may receive a signal for updating the above-described set values from an operator, and the output device(s) may output the quality values to the operator.

Further, the computing device may include communication connection(s) for enabling communication with other devices via a network. Here, the communication connection(s) may include a modem, a network interface card (NIC), an integrated network interface, a radio frequency transmitter/receiver, an infrared port, a universal serial bus (USB) connection, or other interface for connecting the computing device to another computing device. Further, the communication connection(s) may include a wired connection or a wireless connection.

The communication connection(s) may serve as the above-described data collector.

Each component of the above-described computing device may be connected by various interconnects such as a bus (e.g., a peripheral component interconnect (PCI), a USB, a firmware (IEEE 1394), an optical bus structure, and the like) and may be interconnected by a network.

That is, the data collector, the storage, and the quality value generator, which are described above, may be remotely connected to one another via interconnections.

The terms "component," "module," "system," "interface," and the like used herein generally refer to hardware, a combination of hardware and software, software, or a computer-related entity which is software that is being executed. For example, a component may be a process running on a processor, a processor, an object, an executable, an execution thread, a program, and/or a computer, but the present invention is not limited thereto. For example, both the controller and the application running on the controller may be components. One or more components may be present within a process and/or an execution thread, may be localized on a single computer, and may be distributed among two or more computers.

While the exemplary embodiments of the present invention has been described, the present invention is not limited to these exemplary embodiments, and various modifications can be devised by those skilled in the art to which the present invention pertains without departing from the gist of the present invention as defined by the appended claims.

The invention claimed is:

1. An apparatus for generating data quality information of electric power equipment, the apparatus comprising:
   a data collector configured to receive a piece of measured data from electric power equipment; and
   a quality value generator configured to include a logic circuit for generating a quality value based on a result of comparing the piece of measured data with set values stored in advance,
   wherein the piece of measured data has an enumerated structure, and
   the quality value corresponds to a quality value for a piece of measured data of a hierarchical structure,
   wherein the pieces of measured data include a sequence number value, a measured time value, a measured value, and a data type value,
   wherein the set values include a set data type value, a set minimum data value, a set maximum data value, a set minimum reference data value, a set maximum reference data value, a variable time, a variable value, and a set measurement period value, and
   wherein the logic circuit includes
   a first logic circuit for generating a type quality value based on a result of comparing the data type value with the set data type value;
   a second logic circuit for generating a range quality value based on a result of comparing the measured value with the set maximum data value;
   a third logic circuit for generating a reference quality value based on a result of comparing the measured value with the set maximum reference data value;
   a fourth logic circuit for generating a varied quality value based on a result of comparing the time at which the measured value reaches the variable value with the variable time; and
   a fifth logic circuit for generating an omitted quality value according to whether the measured value is updated for a period corresponding to the set measurement period value.

2. The apparatus of claim 1, wherein:
the piece of measured data of the enumerated structure follows at least one among a distributed network protocol (DNP), a Modbus, and a user datagram protocol (UDP).

3. The apparatus of claim 1, wherein:
the data collector collects a piece of measured data of an enumerated structure from the electric power equipment and collects a piece of measured data of a hierarchical structure from a second electric power equipment,
the storage stores a previous value and a set value for the piece of measured data of the enumerated structure, and
the quality value generator generates a quality value for the piece of measured data of the enumerated structure.

4. The apparatus of claim 3, wherein:
the quality value generator converts the piece of measured data from the enumerated structure into a hierarchical structure by applying the generated quality value to the piece of measured data of the enumerated structure.

5. The apparatus of claim 1, wherein:
the quality value generator generates a second quality value according to verification of the piece of measured data and generates a comprehensive quality value on the basis of the quality value according to the logic circuit and the second quality value.

6. The apparatus of claim 1, wherein:
the piece of measured data includes a power factor value of the electric power equipment,
the set value includes a set range value of the power factor value and a set denominator range value of the power factor value, and
the quality value generator generates a range quality value corresponding to whether the power factor value of the electric power equipment is out of the set range value of the power factor value and generates a reference quality value corresponding to whether a denominator of the power factor value of the electric power equipment is out of the set denominator range value of the power factor value.

7. A method for generating data quality information of electric power equipment, the method comprising:
   receiving a piece of measured data from electric power equipment; and
   generating a quality value by using a logic circuit for generating a quality value based on a result of comparing the piece of measured data with set values stored in advance,
   wherein the piece of measured data has an enumerated structure, and
   the quality value corresponds to a quality value for a piece of measured data of a hierarchical structure,
   wherein the pieces of measured data include a sequence number value, a measured time value, a measured value, and a data type value,
   wherein the set values include a set data type value, a set minimum data value, a set maximum data value, a set minimum reference data value, a set maximum reference data value, a variable time, a variable value, and a set measurement period value, and wherein the logic circuit includes
a first logic circuit for generating a type quality value based on a result of comparing the data type value with the set data type value;
a second logic circuit for generating a range quality value based on a result of comparing the measured value with the set maximum data value;
a third logic circuit for generating a reference quality value based on a result of comparing the measured value with the set maximum reference data value;
a fourth logic circuit for generating a varied quality value based on a result of comparing the time at which the measured value reaches the variable value with the variable time; and
a fifth logic circuit for generating an omitted quality value according to whether the measured value is updated for a period corresponding to the set measurement period value.

8. The method of claim 7, wherein the generating of the quality value includes:
generating a first quality value according to the logic circuit;
generating a second quality value according to verification on the piece of measured data; and
generating a comprehensive quality value on the basis of the first quality value and the second quality value.

* * * * *